US012308310B2

United States Patent
Huang

(10) Patent No.: US 12,308,310 B2
(45) Date of Patent: May 20, 2025

(54) METHOD FOR FORMING SEMICONDUCTOR INTERCONNECTION STRUCTURE AGAINST STRESS MIGRATION

(71) Applicant: NANYA TECHNOLOGY CORPORATION, New Taipei (TW)

(72) Inventor: Sheng-Fu Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 405 days.

(21) Appl. No.: 17/662,079

(22) Filed: May 5, 2022

(65) Prior Publication Data

US 2023/0361021 A1 Nov. 9, 2023

(51) Int. Cl.
*H01L 23/522* (2006.01)
*H01L 21/768* (2006.01)
*H01L 23/528* (2006.01)
*H01L 23/532* (2006.01)

(52) U.S. Cl.
CPC .... *H01L 23/5226* (2013.01); *H01L 21/76831* (2013.01); *H01L 21/76843* (2013.01); *H01L 23/5283* (2013.01); *H01L 23/53266* (2013.01)

(58) Field of Classification Search
CPC .......... H01L 23/5226; H01L 21/76832; H01L 21/76843; H01L 21/76844; H01L 23/53238; H01L 23/53266; H01L 21/76831; H01L 21/76865; H01L 21/76829
See application file for complete search history.

(56) References Cited

U.S. PATENT DOCUMENTS

| | | | | |
|---|---|---|---|---|
| 2002/0033537 A1* | 3/2002 | Higashi | ............ | H01L 23/53252 257/E23.161 |
| 2002/0155695 A1* | 10/2002 | Lee | .................. | H01L 21/76807 257/E21.279 |
| 2012/0248609 A1* | 10/2012 | Tomita | ................ | H01L 23/5226 257/E23.161 |
| 2019/0067089 A1* | 2/2019 | Yang | ................... | H01L 23/5226 |
| 2020/0006140 A1 | 1/2020 | Tapily et al. | | |
| 2020/0395294 A1* | 12/2020 | Liang | ................ | H01L 21/76813 |
| 2022/0130721 A1* | 4/2022 | Bouche | ............ | H01L 21/76844 |

* cited by examiner

*Primary Examiner* — John A Bodnar
(74) *Attorney, Agent, or Firm* — CKC & Partners Co., LLC

(57) ABSTRACT

A semiconductor interconnection structure includes a lower inter-level dielectric layer located above a substrate, a lower metal via located in the lower inter-level dielectric layer, a first horizontal dielectric layer located over the lower inter-level dielectric layer and the lower metal via, an upper inter-level dielectric layer located over the first horizontal dielectric layer and having a dielectric constant smaller than that of the first horizontal dielectric layer, an upper metal via located in the upper inter-level dielectric layer and the first horizontal dielectric layer, and electrically connected to the lower metal via, a diffusion barrier layer located around the upper metal via, and located between the upper inter-level dielectric layer and the upper metal via; and a dielectric sidewall located the diffusion barrier layer and the upper inter-level dielectric layer.

12 Claims, 8 Drawing Sheets

METHOD FOR FORMING SEMICONDUCTOR INTERCONNECTION STRUCTURE AGAINST STRESS MIGRATION

BACKGROUND

Field of Disclosure

The present disclosure relates to a semiconductor interconnection structure.

Description of Related Art

An integrated circuit (IC) device (also referred to as a semiconductor chip) can contain millions of transistors and other circuit elements that are fabricated on a single silicon crystal substrate (wafer). For the IC device to be functional, a complex network of signal paths will normally be routed to connect the circuit elements distributed on the surface of the device. Efficient routing of these signals across the device can become more difficult as the complexity and number of circuit elements are increased. Thus, the formation of multi-level or multi-layered interconnection schemes such as, for example, dual damascene wiring (interconnect) structures, have become more desirable due to their efficacy in providing high speed signal routing patterns between large numbers of transistors and other circuit elements on a complex IC.

SUMMARY

The present disclosure provides semiconductor structures and semiconductor manufacturing methods to deal with the needs of the prior art problems.

In one or more embodiments, a semiconductor interconnection structure includes a lower inter-level dielectric layer disposed above a substrate; a lower metal via disposed in the lower inter-level dielectric layer; a first horizontal dielectric layer disposed over the lower inter-level dielectric layer and the lower metal via; an upper inter-level dielectric layer disposed over the first horizontal dielectric layer and having a dielectric constant smaller than that of the first horizontal dielectric layer; an upper metal via disposed in the upper inter-level dielectric layer and the first horizontal dielectric layer, and electrically connected to the lower metal via; a diffusion barrier layer disposed around the upper metal via, and disposed between the upper inter-level dielectric layer and the upper metal via; and a dielectric sidewall disposed between the diffusion barrier layer and the upper inter-level dielectric layer.

In one or more embodiments, the dielectric sidewall has a higher rigidity than the upper inter-level dielectric layer.

In one or more embodiments, the first horizontal dielectric layer has a higher rigidity than the upper inter-level dielectric layer.

In one or more embodiments, the dielectric sidewall has a dielectric constant greater than that of the upper inter-level dielectric layer.

In one or more embodiments, the first horizontal dielectric layer has a coefficient of thermal expansion smaller than that of the upper inter-level dielectric layer.

In one or more embodiments, the upper metal via has a T-shaped cross section.

In one or more embodiments, the first horizontal dielectric layer has a coefficient of thermal expansion smaller than that of the upper metal via.

In one or more embodiments, the dielectric sidewall is an atomic layer deposition oxide layer.

In one or more embodiments, the dielectric sidewall is an atomic layer deposition nitride layer.

In one or more embodiments, a semiconductor interconnection structure includes a lower inter-level dielectric layer disposed above a substrate; a lower metal via disposed in the lower inter-level dielectric layer; a first horizontal dielectric layer disposed over the lower inter-level dielectric layer and the lower metal via; an upper inter-level dielectric layer disposed over the first horizontal dielectric layer and having a dielectric constant smaller than that of the first horizontal dielectric layer; an upper metal via disposed in the upper inter-level dielectric layer and the first horizontal dielectric layer, and electrically connected to the lower metal via; a diffusion barrier layer disposed around the upper metal via, and disposed between the upper inter-level dielectric layer and the upper metal via; a dielectric sidewall disposed between the diffusion barrier layer and the upper inter-level dielectric layer; and a second horizontal dielectric layer disposed over the upper inter-level dielectric layer.

In one or more embodiments, the dielectric sidewall is substantially perpendicular to a top surface of the first horizontal dielectric layer.

In one or more embodiments, the dielectric sidewall is connected to the first horizontal dielectric layer.

In one or more embodiments, the dielectric sidewall is spaced from the second horizontal dielectric layer.

In one or more embodiments, the upper metal via has a T-shaped cross section.

In one or more embodiments, the lower metal via has a rectangular cross section.

In one or more embodiments, the dielectric sidewall is connected between the first horizontal dielectric layer and the second horizontal dielectric layer.

In one or more embodiments, the dielectric sidewall is an atomic layer deposition oxide layer or an atomic layer deposition nitride layer.

In one or more embodiments, the diffusion barrier layer comprises at least one of tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), and tantalum silicon nitride (TaSiN).

In sum, the semiconductor interconnection structure disclosed herein has an additional rigid dielectric sidewall sandwiched between its metal via and low-k "loose" inter-level dielectric layer so as to avoid stress migration resulted from thermal expansion of the metal via. The rigid dielectric sidewall may have its top end or bottom end connected to the (upper or lower) horizontal dielectric layers to collectively encapsulate and protect the low-k "loose" inter-level dielectric layer against stress migration resulted from thermal expansion of the metal via.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
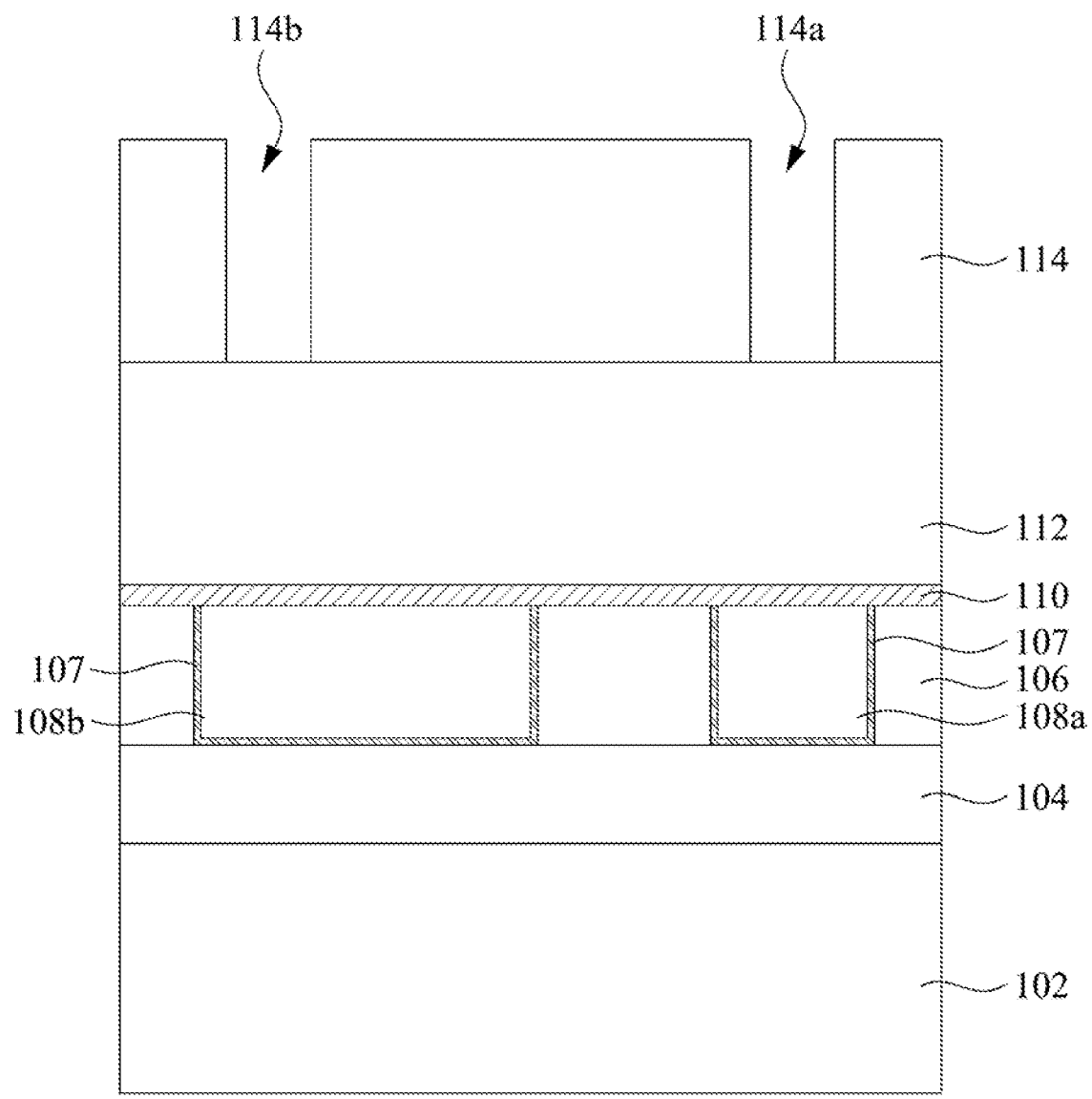
FIGS. 1-7 illustrate cross sections of semiconductor manufacturing steps according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which illustrates a cross sectional view of a first semiconductor manufacturing step according to some embodiments of the present disclosure. A semiconductor interconnection structure 100, as part of back end of line (BEOL), is formed over a semiconductor substrate 102 and one or more integrated circuit devices 104. In some embodiments of the present disclosure, the substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be an integrated circuit die, such as a logic die, a memory die, an ASIC die, or the like. The substrate 102 may be a complementary metal oxide semiconductor (CMOS) die and may be referred to as a CMOS under array (CUA). The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. In some embodiments of the present disclosure, the integrated circuit device 104 may include at least one of diodes, bipolar junction transistors, field-effect transistors, metal-oxide-semiconductors.

In some embodiments of the present disclosure, the semiconductor interconnection structure 100 may include a lower inter-level dielectric layer 106 formed above the substrate 102 and the one or more integrated circuit devices 104. The lower inter-level dielectric layer 106 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Xerogel, Aerogel, amorphous fluorinated carbon, Parylene, BCB (bis-benzocyclobutenes), polyimide, other suitable materials, or combinations thereof. The lower inter-level dielectric layer 106 may have a multilayer structure. The lower inter-level dielectric layer 106 may be formed by a technique including spin-on coating, CVD, sputtering, or other suitable processes. The lower inter-level dielectric layer 106 may be formed by an integrated process including a damascene process, such as a dual damascene process or single damascene process.

In some embodiments of the present disclosure, the semiconductor interconnection structure 100 may include one or more lower metal vias (108a, 108b) formed in the lower inter-level dielectric layer 106. Each lower metal via (108a or 108b) may be formed using metals and/or metal alloys such as aluminum (Al), titanium (Ti), cobalt (Co), silver (Ag), gold (Au), copper (Cu), nickel (Ni), chromium (Cr), hafnium (Hf), ruthenium (Ru), tungsten (W), platinum (Pt), alloys thereof, or the like. Each lower metal via (108a or 108b) is encapsulated by a diffusion barrier layer 107 which may be formed using at least one of tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), and tantalum silicon nitride (TaSiN). The diffusion barrier layer 107 is used for lining bottoms and sidewalls of via holes in the lower inter-level dielectric layer 106. After forming the lower inter-level dielectric layer 106 and the lower metal vias (108a, 108b), a chemical mechanical polishing (CMP) step may be used to remove excess metal to achieve a planarized interconnect structure.

In some embodiments of the present disclosure, the semiconductor interconnection structure 100 may include a first horizontal dielectric layer 110 over top surfaces of the lower inter-level dielectric layer 106 and the lower metal vias (108a, 108b). The first horizontal dielectric layer 110 may include or be formed from at least one of a dielectric material, e.g. a semiconductor carbide (e.g. silicon carbide (SiC)), a semiconductor oxide (e.g. silicon oxide (SiO2)), a semiconductor nitride (e.g. silicon nitride (SiN)) and a semiconductor oxycarbide (e.g. silicon oxycarbide (SiOC)).

In some embodiments of the present disclosure, the semiconductor interconnection structure 100 may include an upper inter-level dielectric layer 112 formed over the first horizontal dielectric layer 110. The upper inter-level dielectric layer 112 may be include or be formed from at least one of a low-k dielectric material, silicon dioxide, silicon nitride, silicon oxynitride, TEOS oxide, phosphosilicate glass (PSG), borophosphosilicate glass (BPSG), fluorinated silica glass (FSG), carbon doped silicon oxide, Xerogel, Aerogel, amorphous fluorinated carbon, Parylene, BCB (bis-benzocyclobutenes), polyimide, other suitable materials, or combinations thereof. The upper inter-level dielectric layer 112 is manufactured to have a dielectric constant smaller than that of the first horizontal dielectric layer 110.

In some embodiments of the present disclosure, a photoresist layer 114 may be lithographically patterned to form two openings (114a, 114b) thereon. The opening 114a is aligned with the lower metal via 108a. The opening 114b is aligned with the lower metal via 108b.

Figure 2:
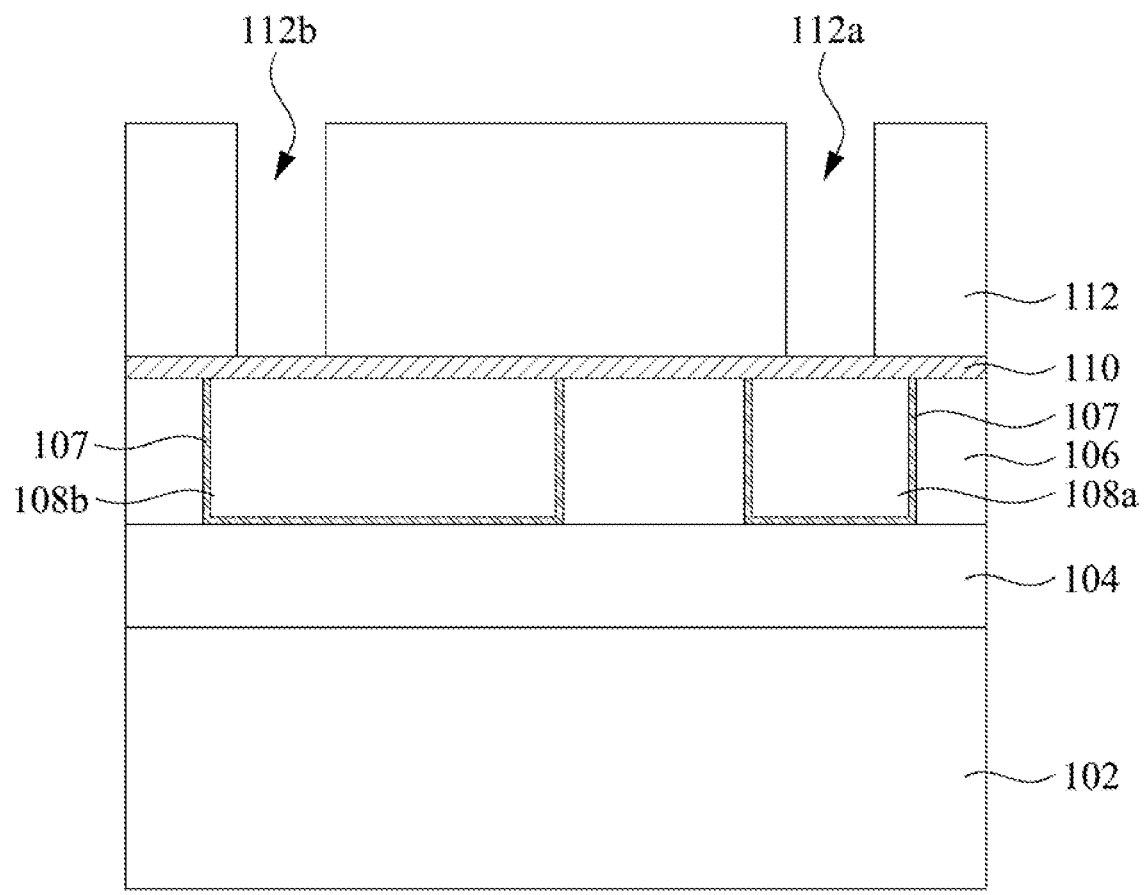

Reference is made to FIG. 2, which illustrates a cross sectional view of a second semiconductor manufacturing step according to some embodiments of the present disclosure. An etching process is performed using the patterned photoresist layer 114 as a mask to form via holes (112a, 112b). The via hole 112a is aligned with the lower metal via 108a. The via hole 112b is aligned with the lower metal via 108b. After the etching process is performed, the patterned photoresist layer 114 is then removed.

Figure 3:
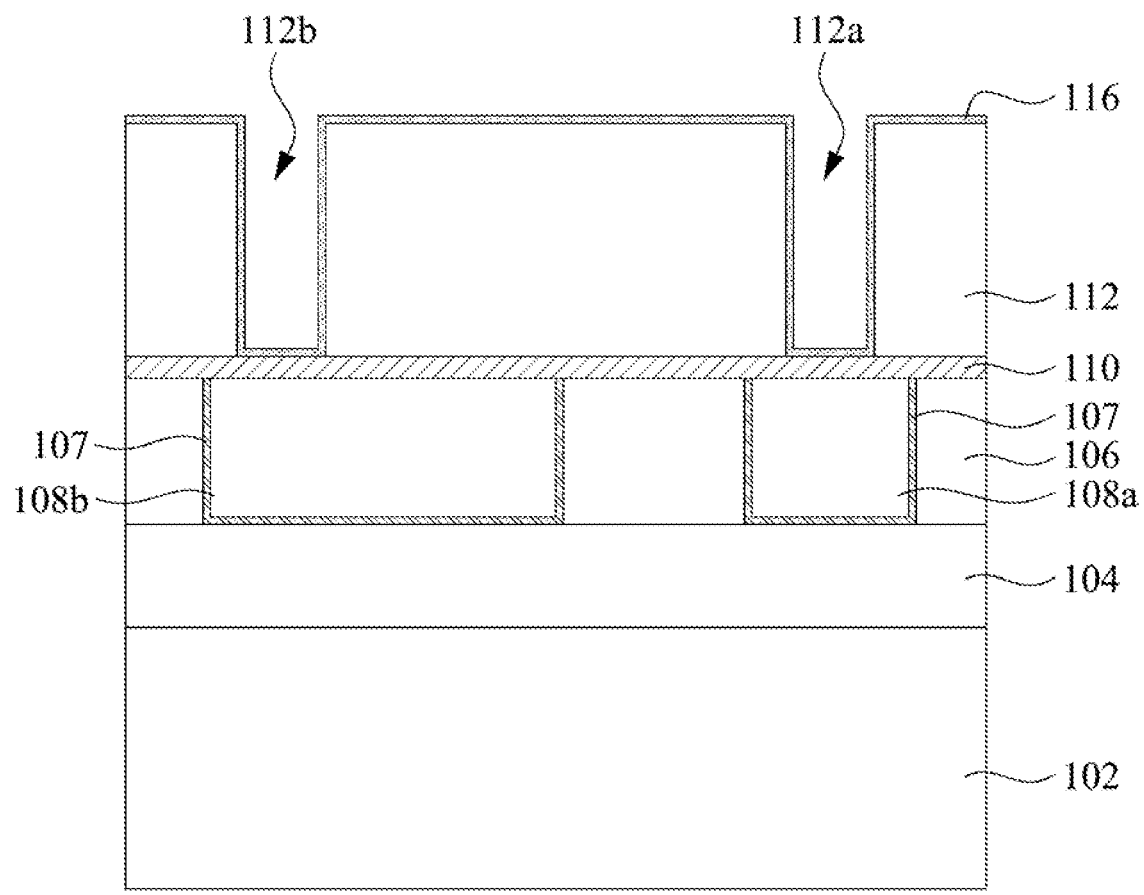

Reference is made to FIG. 3, which illustrates a cross sectional view of a third semiconductor manufacturing step according to some embodiments of the present disclosure. A dielectric layer 116 is formed to line exposed surfaces of the upper inter-level dielectric layer 112 and its via holes (112a, 112b). In some embodiments of the present disclosure, the dielectric layer 116 is formed using an atomic layer deposition process to form a rigid dielectric layer to encapsulate the low-k upper inter-level dielectric layer 112. In some embodiments of the present disclosure, the dielectric layer 116 may be an atomic layer deposition oxide layer, e.g., silicon oxide, or an atomic layer deposition nitride layer, e.g., silicon nitride.

Figure 4:
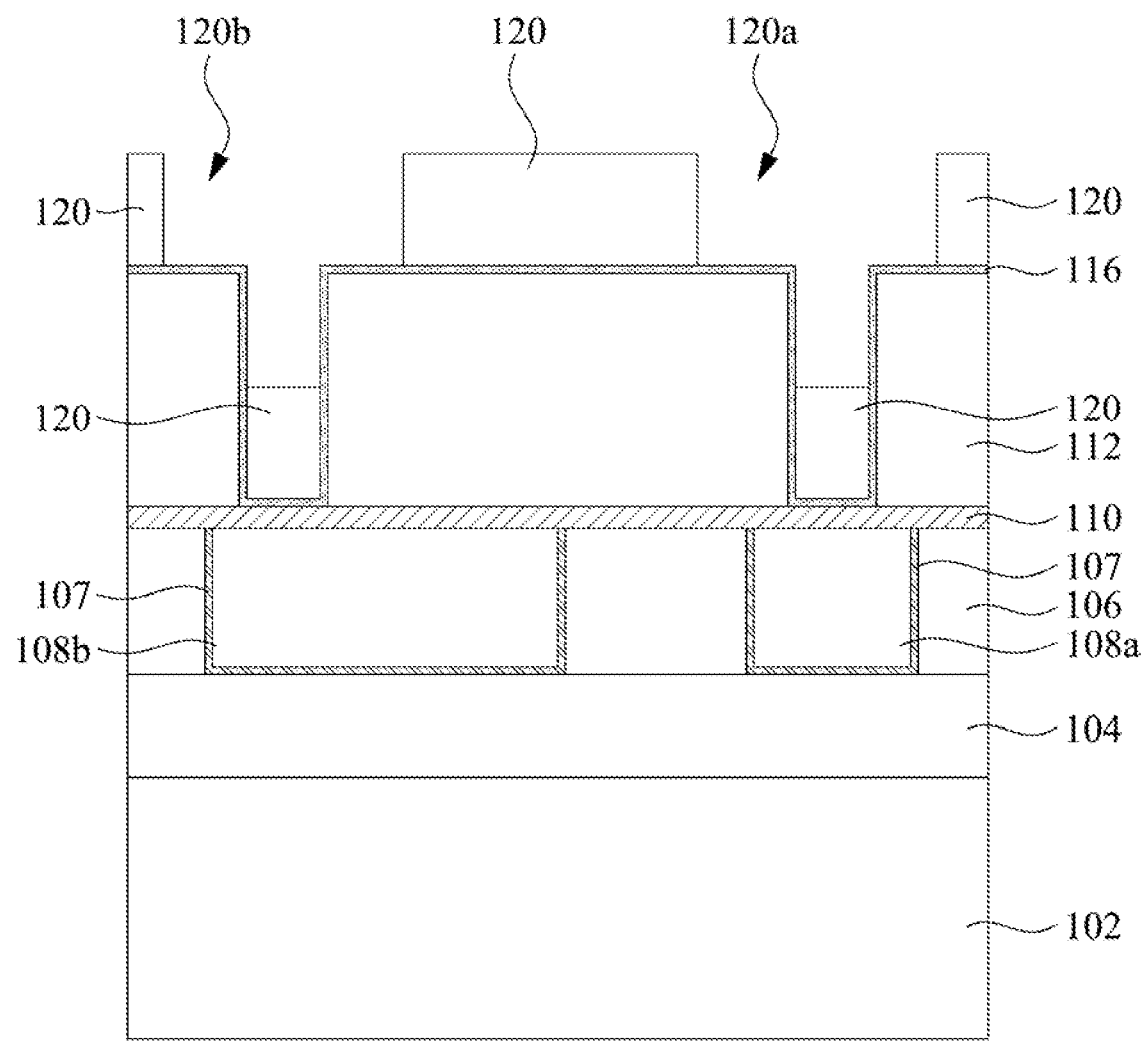

Reference is made to FIG. 4, which illustrates a cross sectional view of a fourth semiconductor manufacturing step according to some embodiments of the present disclosure. A photoresist layer 120 may be lithographically patterned to form two openings (120a, 120b) thereon. The opening 120a is aligned with the lower metal via 108a. The opening 120b is aligned with the lower metal via 108b.

Figure 5:
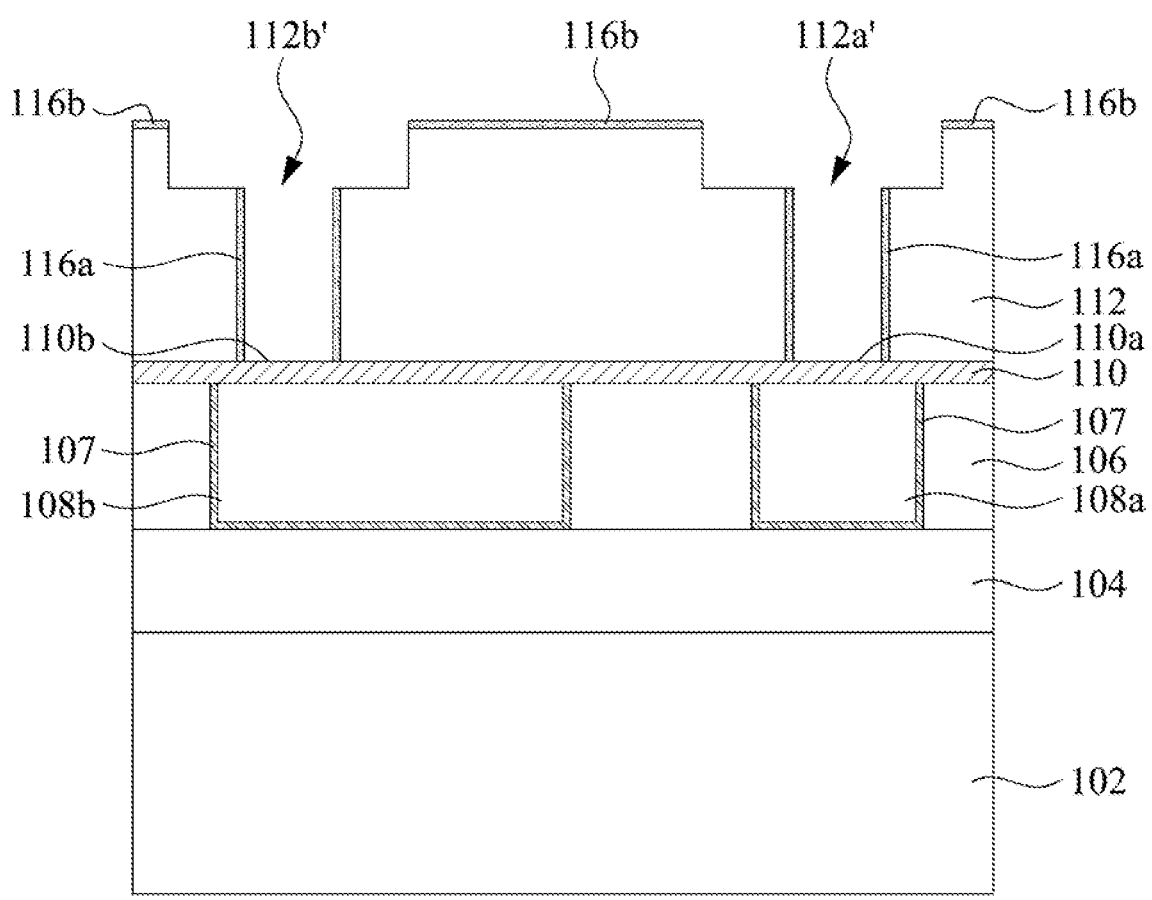

Reference is made to FIG. 5, which illustrates a cross sectional view of a fifth semiconductor manufacturing step according to some embodiments of the present disclosure. An etching process is performed using the patterned photoresist layer 120 as a mask to form T-shaped via holes (112a', 112b') and to remove portions of the dielectric layer 116. The first horizontal dielectric layer 110 is exposed in bottoms of the T-shaped via holes (112a', 112b') after the etching process. Only dielectric sidewalls 116a are remained in the T-shaped via holes (112a', 112b'). After the etching process is performed, the patterned photoresist layer 120 is then removed.

Figure 6:
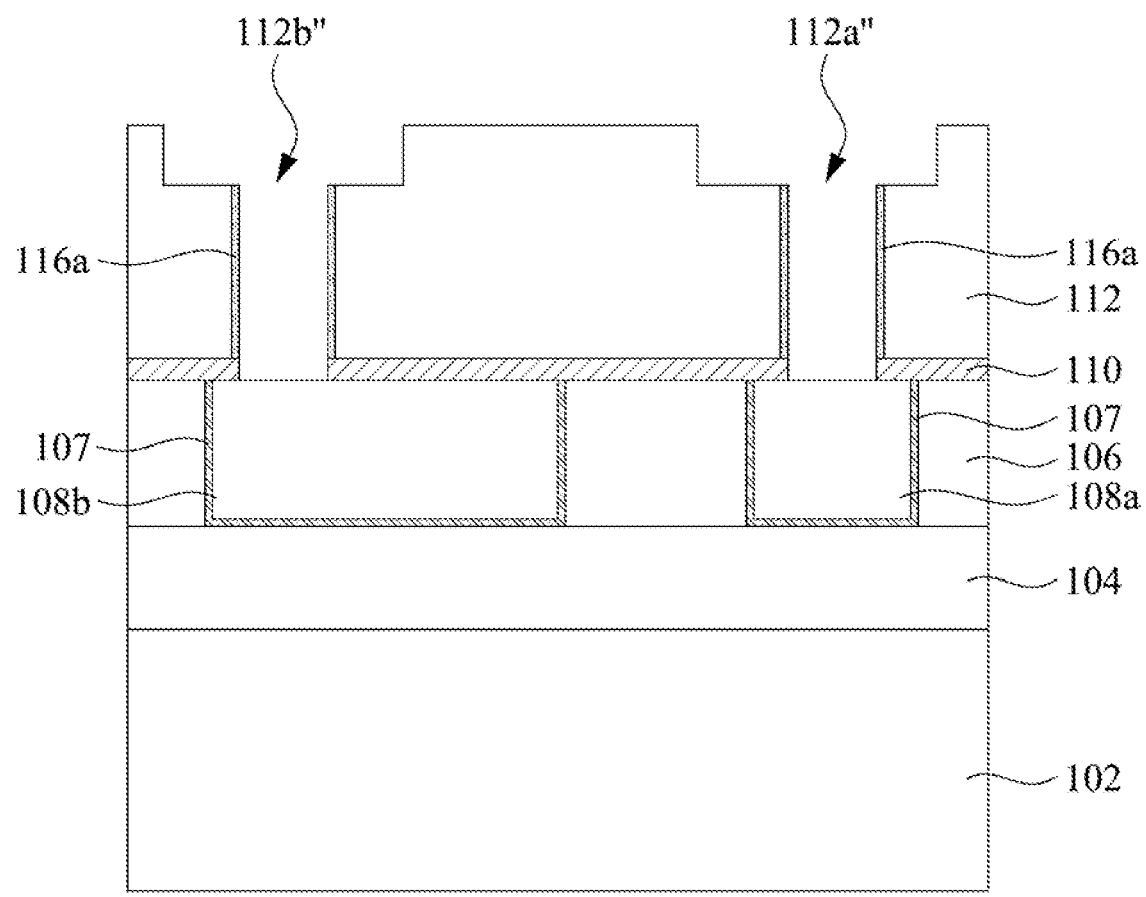

Reference is made to FIG. 6, which illustrates a cross sectional view of a sixth semiconductor manufacturing step according to some embodiments of the present disclosure. A punch etching process is performed to remove portions (110a, 110b) of the first horizontal dielectric layer 110 and portions 116b of the dielectric layer 116 (also referring to FIG. 5) to form T-shaped via holes (112a", 112b"). Therefore, the lower metal vias (108a, 108b) are exposed in bottoms of the T-shaped via holes (112a", 112b") respectively after the etching process. Dielectric sidewalls 116a are remained in the T-shaped via holes (112a", 112b").

Figure 7:
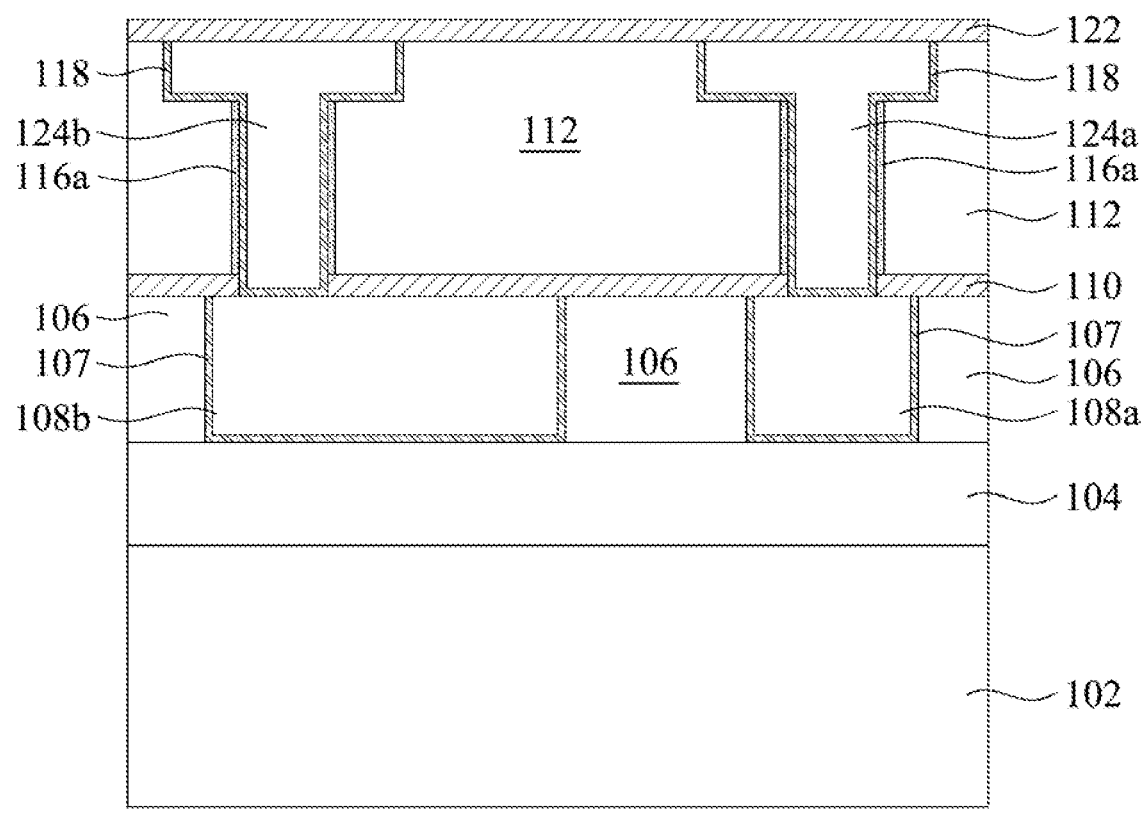

Reference is made to FIG. 7, which illustrates a cross sectional view of a seventh semiconductor manufacturing step according to some embodiments of the present disclosure. A diffusion barrier layer 118 may be formed using at least one of tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), and tantalum silicon nitride (TaSiN) to be deposited on sidewalls and bottoms of the T-shaped via holes (112a", 112b"). The diffusion barrier layer 118 is used for lining bottoms and sidewalls of the T-shaped via holes (112a", 112b") in the upper inter-level dielectric layer 112. An etching process may be performed to remove portions of the diffusion barrier layer 118 that are not in the T-shaped via holes (112a", 112b"). Upper metal vias (124a, 124b) are formed in the T-shaped via holes (112a", 112b") respectively, and electrically connected to the lower metal vias (108a, 108b) respectively. Each upper metal via (124a or 124b) may be formed using metals and/or metal alloys such as aluminum (Al), titanium (Ti), cobalt (Co), silver (Ag), gold (Au), copper (Cu), nickel (Ni), chromium (Cr), hafnium (Hf), ruthenium (Ru), tungsten (W), platinum (Pt), alloys thereof, or the like. Each upper metal via (124a or 124b) is encapsulated by the diffusion barrier layer 118. After forming the upper metal vias (124a, 124b) in the T-shaped via holes (112a", 112b"), a chemical mechanical polishing (CMP) step may be used to remove excess metal to achieve a planarized interconnect structure. A second horizontal dielectric layer 122 is formed over top surfaces of the upper inter-level dielectric layer 112 and the upper metal vias (124a, 124b). The second horizontal dielectric layer 122 may include or be formed from at least one of a dielectric material, e.g. a semiconductor carbide (e.g. silicon carbide (SiC)), a semiconductor oxide (e.g. silicon oxide (SiO2)), a semiconductor nitride (e.g. silicon nitride (SiN)) and a semiconductor oxycarbide (e.g. silicon oxycarbide (SiOC)). Portions of the second horizontal dielectric layer 122 may be removed later to expose tops of the upper metal vias (124a, 124b) such that another metal via or bonding pad can be landed thereon and connected.

In some embodiments of the present disclosure, each of the upper metal vias (124a, 124b) and the lower metal vias (108a, 108b) can be made from Copper (Cu) and Cu alloys. Copper (Cu) and Cu alloys are used for replacing aluminum (Al) and Al alloys in interconnect metallizations. Cu is relatively inexpensive, easy to process, and has a lower resistivity than Al. In addition, Cu has improved electrical properties vis-a-vis tungsten (W), making Cu a desirable metal for use as a conductive plug as well as conductive wiring. As used herein, "Cu" is intended to encompass high purity elemental copper as well as Cu-based alloys, such as Cu alloys containing minor amounts of tin, zinc, manganese, titanium, magnesium and germanium. The upper inter-level dielectric layer 112 is also made "loose" to be low-k dielectric, e.g., the upper inter-level dielectric layer 112 may have a dielectric constant smaller than that of the first horizontal dielectric layer 110. Therefore, such semiconductor interconnection structure may have a better electrical characteristics, e.g., improved RC delay due to lower resistance in metal vias and lower dielectric constant in inter-level dielectric layer.

In some embodiments of the present disclosure, the dielectric sidewall 116a may have a higher rigidity or stiffness, i.e., resisting deformation in response to an applied force, than the upper inter-level dielectric layer 112 such that the dielectric sidewall 116a can be used to protect the low-k "loose" upper inter-level dielectric layer 112 against stress migration from thermal expansion of the upper metal vias (124a, 124b). Similarly, the first horizontal dielectric layer 110 may have a higher rigidity or stiffness than the upper inter-level dielectric layer 112, and the second horizontal dielectric layer 122 may have a higher rigidity or stiffness than the upper inter-level dielectric layer 112. In some embodiments of the present disclosure, the dielectric sidewall 116a may be formed by an atomic layer deposition process to achieve such higher rigidity or stiffness.

In some embodiments of the present disclosure, the dielectric sidewall 116a may have a dielectric constant greater than that of the upper inter-level dielectric layer 112 such that the dielectric sidewall 116a can be used to protect the low-k "loose" upper inter-level dielectric layer 112 against stress migration from thermal expansion of the upper metal vias (124a, 124b). Similarly, the first horizontal dielectric layer 110 may have a dielectric constant greater than that of the upper inter-level dielectric layer 112, and the second horizontal dielectric layer 122 may have a dielectric constant greater than that of the upper inter-level dielectric layer 112. In some embodiments of the present disclosure, the dielectric sidewall 116a may be formed by an atomic layer deposition process to achieve desired dielectric constant.

In some embodiments of the present disclosure, the dielectric sidewall 116a may have a coefficient of thermal expansion smaller than that of the upper inter-level dielectric layer 112 such that the dielectric sidewall 116a can be used to protect the low-k "loose" upper inter-level dielectric layer 112 against stress migration from thermal expansion of the upper metal vias (124a, 124b). Similarly, the first horizontal dielectric layer 110 may have a coefficient of thermal expansion smaller than that of the upper inter-level dielectric layer 112, and the second horizontal dielectric layer 122 may have a coefficient of thermal expansion smaller than that of the upper inter-level dielectric layer 112. The dielectric sidewall 116a may also have a coefficient of thermal expansion smaller than that of the upper metal vias (124a, 124b). Similarly, the first horizontal dielectric layer 110 may have a coefficient of thermal expansion smaller than that of the upper metal vias (124a, 124b), and the second horizontal dielectric layer 122 may have a coefficient of thermal expansion smaller than that of the upper metal vias (124a, 124b). In some embodiments of the present disclosure, the dielectric sidewall 116a may be formed by an atomic layer deposition process to achieve desired coefficient of thermal expansion.

In some embodiments of the present disclosure, the upper metal vias (124a, 124b) may both have a T-shaped cross section such that each upper metal via (124a or 124b) have a wider top portion to which another metal via or bonding pad can be landed and connected. Each upper metal via (124a or 124b) has its bottom electrically connected to a corresponding lower metal via (108a or 108b) with a rectangular cross section.

In some embodiments of the present disclosure, the dielectric sidewall 116a is substantially perpendicular to a top surface of the first horizontal dielectric layer 110. In some embodiments of the present disclosure, the dielectric sidewall 116a is substantially perpendicular to a bottom surface of the second horizontal dielectric layer 122.

In some embodiments of the present disclosure, the dielectric sidewall 116a is connected to the first horizontal dielectric layer 110, e.g., the dielectric sidewall 116a has its bottom end in contact with the first horizontal dielectric layer 110, such that the dielectric sidewall 116a and the first horizontal dielectric layer 110 are joined to collectively protect the low-k "loose" upper inter-level dielectric layer 112 against stress migration from thermal expansion of the upper metal vias (124a, 124b).

In some embodiments of the present disclosure, the dielectric sidewall 116a is spaced from the second horizontal dielectric layer 122, e.g., the dielectric sidewall 116a has its top end spaced from the second horizontal dielectric layer 122, due to a damascene process.

Figure 8:
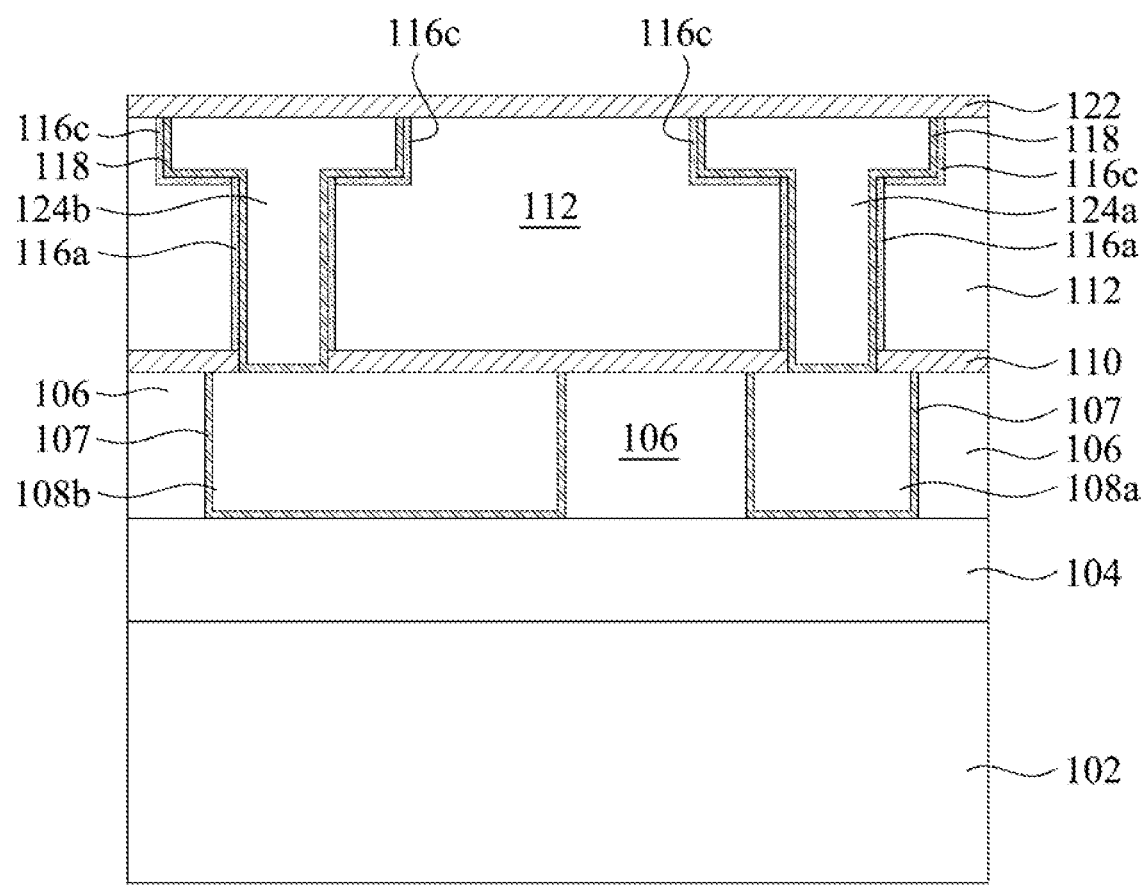
FIG. 8 illustrates a cross section view of a semiconductor interconnection structure according to some embodiments of the present disclosure.

Reference is made to FIG. 8, which illustrates a cross section view of a semiconductor interconnection structure 100' according to some embodiments of the present disclosure. The semiconductor interconnection structure 100' in FIG. 8 is different from the semiconductor interconnection structure 100 in FIG. 7 in that each dielectric sidewall 116c is formed by further steps to interconnect a corresponding dielectric sidewall 116a and the second horizontal dielectric layer 122. Therefore, the continuous dielectric sidewall 116c and dielectric sidewall 116a is connected between the first horizontal dielectric layer 110 and the second horizontal dielectric layer 122 such that the continuous dielectric sidewalls (116a, 116c) and the horizontal dielectric layers (110, 122) are joined to collectively protect the low-k "loose" upper inter-level dielectric layer 112 against stress migration resulted from thermal expansion of the upper metal vias (124a, 124b). In some embodiments of the present disclosure, the dielectric layer 116c is formed using an atomic layer deposition process. In some embodiments of the present disclosure, the dielectric layer 116c may be an atomic layer deposition oxide layer, e.g., silicon oxide, or an atomic layer deposition nitride layer, e.g., silicon nitride.

In sum, the semiconductor interconnection structure disclosed herein has an additional rigid dielectric sidewall sandwiched between its metal via and low-k "loose" inter-level dielectric layer so as to avoid stress migration resulted from thermal expansion of the metal via. The rigid dielectric sidewall may have its top end or bottom end connected to the (upper or lower) horizontal dielectric layers to collectively encapsulate and protect the low-k "loose" inter-level dielectric layer against stress migration resulted from thermal expansion of the metal via.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor interconnection structure, the method comprising:
   forming a lower inter-level dielectric layer above a substrate;
   forming a lower metal via in the lower inter-level dielectric layer;
   forming a first horizontal dielectric layer over the lower inter-level dielectric layer and the lower metal via;
   forming an upper inter-level dielectric layer over the first horizontal dielectric layer;
   etching a via hole in the upper inter-level dielectric layer;
   forming a dielectric layer to line the via hole;
   forming a photoresist layer over the upper inter-level dielectric layer and the dielectric layer and patterning the photoresist layer to form an opening that has a width greater than that of the via hole;
   using the patterned photoresist layer as a mask to perform an etching process to the upper inter-level dielectric layer and the dielectric layer to form a T-shaped via hole, wherein the etched dielectric layer remains in the T-shaped via hole to form a dielectric sidewall;
   etching the first horizontal dielectric layer exposed in the T-shaped via hole to exposed the lower metal via;
   forming a diffusion barrier layer in the T-shaped via hole, wherein the diffusion barrier layer is in contact with the dielectric sidewall; and
   forming a an upper metal via in the T-shaped via hole to be electrically coupled with the lower metal via.

2. The method of claim 1, wherein the dielectric sidewall has a higher rigidity than the upper inter-level dielectric layer.

3. The method of claim 1, wherein the first horizontal dielectric layer has a higher rigidity than the upper inter-level dielectric layer.

4. The method of claim 1, wherein the dielectric sidewall has a dielectric constant greater than that of the upper inter-level dielectric layer.

5. The method of claim 1, wherein the dielectric sidewall has a coefficient of thermal expansion smaller than that of the upper inter-level dielectric layer.

6. The method of claim 1, wherein the first horizontal dielectric layer has a coefficient of thermal expansion smaller than that of the upper inter-level dielectric layer.

7. The method of claim 1, wherein the upper metal via has a T-shaped cross section.

8. The method of claim 1, wherein the dielectric sidewall has a coefficient of thermal expansion smaller than that of the upper metal via.

9. The method of claim 1, wherein the first horizontal dielectric layer has a coefficient of thermal expansion smaller than that of the upper metal via.

10. The method of claim 1, wherein the dielectric sidewall is an atomic layer deposition oxide layer.

11. The method of claim 1, wherein the dielectric sidewall is an atomic layer deposition nitride layer.

12. The method of claim 1, wherein the diffusion barrier layer comprises at least one of tantalum (Ta), tantalum nitride (TaN), titanium nitride (TiN), titanium-tungsten (TiW), tungsten (W), tungsten nitride (WN), Ti-TiN, titanium silicon nitride (TiSiN), tungsten silicon nitride (WSiN), and tantalum silicon nitride (TaSiN).

* * * * *